(12) United States Patent
Nanda et al.

(10) Patent No.: US 8,084,313 B2
(45) Date of Patent: Dec. 27, 2011

(54) METHOD FOR FORMING A BIPOLAR JUNCTION TRANSISTOR AND A METAL OXIDE SEMICONDUCTOR FIELD EFFECT TRANSISTOR

(75) Inventors: Arun K. Nanda, Orlando, FL (US);
Venkat Raghavan, Union City, CA (US); Nace Rossi, Singapore (SG)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/832,110

(22) Filed: Jul. 8, 2010

(65) Prior Publication Data

US 2010/0273301 A1    Oct. 28, 2010

Related U.S. Application Data

(62) Division of application No. 12/208,929, filed on Sep. 11, 2008, now Pat. No. 7,776,678.

(51) Int. Cl.
*H01L 21/8238* (2006.01)

(52) U.S. Cl. ........ 438/207; 438/205; 438/224; 257/197; 257/370

(58) Field of Classification Search .................. 438/205, 438/207, 224, 234; 257/197, 370, 378
See application file for complete search history.

(56) References Cited

U.S. PATENT DOCUMENTS

| | | | |
|---|---|---|---|
| 4,921,811 A | 5/1990 | Watanabe et al. | |
| 5,334,549 A * | 8/1994 | Eklund | 438/207 |
| 6,248,650 B1 | 6/2001 | Johnson | |
| 6,602,747 B1 | 8/2003 | Yang et al. | |
| 6,686,250 B1 | 2/2004 | Kalnitsky et al. | |
| 6,797,580 B1 | 9/2004 | Yin et al. | |
| 7,319,251 B2 * | 1/2008 | Minixhofer et al. | 257/197 |
| 7,439,119 B2 | 10/2008 | Nanda et al. | |
| 2001/0002061 A1 | 5/2001 | Johnson | |
| 2005/0020003 A1 | 1/2005 | Johansson et al. | |
| 2005/0040470 A1 | 2/2005 | Chuang et al. | |
| 2006/0252215 A1 * | 11/2006 | Kerr et al. | 438/309 |
| 2007/0069295 A1 | 3/2007 | Kerr et al. | |
| 2007/0202642 A1 | 8/2007 | Nanda et al. | |
| 2008/0230869 A1 * | 9/2008 | Ho et al. | 257/526 |
| 2009/0011553 A1 | 1/2009 | Nanda et al. | |

* cited by examiner

*Primary Examiner* — Phuc Dang

(57) ABSTRACT

A method for forming BiCMOS integrated circuits and structures formed according to the method. After forming doped wells and gate stacks for the CMOS devices and collector and base regions for the bipolar junction transistor, an emitter layer is formed within an emitter window. A dielectric material layer is formed over the emitter layer and remains in place during etching of the emitter layer and removal of the etch mask. The dielectric material layer further remains in place during source/drain implant doping and activation of the implanted source/drain dopants. The dielectric material layer functions as a thermal barrier, to limit out-diffusion of the emitter dopants during the activation step.

9 Claims, 21 Drawing Sheets

METHOD FOR FORMING A BIPOLAR JUNCTION TRANSISTOR AND A METAL OXIDE SEMICONDUCTOR FIELD EFFECT TRANSISTOR

CROSS-REFERENCE TO RELATED APPLICATIONS

This Application is a Divisional of U.S. application Ser. No. 12/208,929 filed on Sep. 11, 2008 now U.S. Pat. Ser. No. 7,776,678 to Arun K. Nanda, et al., entitled "ATHERMALLY STABLE BICMOS FABRICATION METHOD AND BIPOLAR JUNCTIN TRANSISTORS FORMED ACCORDING TO THE METHOD,", currently allowed which claims benefit to U.S. application Ser. No. 11/361,430 filed on Feb. 24, 2006, to Arun K. Nanda, et al., entitled "ATHERMALLY STABLE BICMOS FABRICATION METHOD AND BIPOLAR JUNCTIN TRANSISTORS FORMED ACCORDING TO THE METHOD," issued as U.S. Pat. No. 7,439,119 on Oct. 21, 2008; commonly assigned with the present invention and incorporated herein by reference.

FIELD OF THE INVENTION

The present invention relates generally to bipolar junction transistors and more specifically to a thermally stable process for forming bipolar junction transistors and bipolar junction transistors fabricated according to the process.

BACKGROUND OF THE INVENTION

Integrated circuits typically comprise semiconductor devices, such as bipolar junction transistors (BJTS) and metal-oxide semiconductor field effect transistors (MOSFETS) formed from doped regions within a semiconductor layer or substrate. Interconnect structures overlying the substrate connect the BJTS and MOSFETS to form circuits. The interconnect structures comprise conductive runners or traces alternating with dielectric layers. Conductive vias disposed in the dielectric layers connect overlying and underlying conductive runners and traces.

BiCMOS integrated circuits comprise both bipolar junction transistors and CMOS (complementary metal oxide semiconductor field effect) transistors with the fabrication process steps for both devices integrated into one fabrication sequence. Integrating BJTS and MOSFETS on the same integrated circuit die allows the circuit designer to take advantage of both the BJT advantages of high speed and high frequency operation and the MOSFET advantages of low power consumption, high noise immunity and small die area.

The overall process sequence and the individual process steps (e.g., implanting dopants, depositing and patterning material layers, forming openings, epitaxially growing material layers, forming interconnect structures) must be carefully designed and executed to ensure that the process steps for forming the BJTS do not adversely affect the MOSFETS and vice versa, as such adverse effects can lower fabrication yields and increase costs. Thus semiconductor manufactures desire to implement a BiCMOS process flow for fabricating properly operable BJTS and MOSFETS on the same die with a high fabrication yield.

According to conventional BiCMOS processes, a BJT emitter is formed from a polysilicon material layer deposited in an emitter window. First a hard mask layer is formed overlying the emitter polysilicon layer and patterned. The polysilicon layer is etched according to the patterned hard mask and the hard mask is removed. During polysilicon etching the hard mark layer thickness is gradually reduced and the etch process is terminated when the etchant reaches the emitter polysilicon layer. However, during etching an upper region of the emitter polysilicon layer may be consumed, possibly impairing device functionality since a minimum emitter polysilicon thickness is required for proper operation. In an extreme case the bipolar junction transistor can be rendered nonfunctional by excessive erosion of the polysilicon emitter layer.

Known techniques to overcome the effects of emitter layer erosion include forming a thicker polysilicon emitter layer such that notwithstanding erosion the layer is sufficiently thick to present an acceptable resistance. Disadvantageously, this technique increases the stack height of the bipolar junction transistor material layers. Also, it is more difficult to etch a thicker polysilicon layer to form the required emitter region shape.

After forming the BJT emitter, the fabrication sequence forms MOSFET source and drain regions by implanting dopants into the substrate. The substrate is then annealed to repair crystal lattice damage resulting from collisions between the implanting dopants and the lattice atoms and to electrically activate the implanted dopants (i.e., to transfer the implanted dopant atoms from an interstitial to a substitutional state within the silicon crystal). A rapid thermal anneal (at about 1000° C. for about 20 seconds) is required for dopant activation. During the activation process, dopants in the emitter polysilicon tend to out-diffuse to the adjacent base, reducing the effectiveness of the BJT and potentially causing device failure.

It is known to reduce the duration and/or the temperature of the thermal anneal step to reduce dopant out-diffusion, but device functionality may be compromised if the dopant atoms are not completely activated.

BRIEF SUMMARY OF THE INVENTION

A method according to the present invention comprises forming a bipolar junction transistor and a metal oxide semiconductor field effect transistor in a semiconductor layer. The method further comprises providing the semiconductor layer; forming first MOSFET structures in a MOSFET region of the semiconductor layer; forming bipolar junction transistor structures, including an emitter material layer, in a bipolar junction transistor region of the semiconductor layer; forming a first material layer overlying the emitter material layer; patterning the first material layer to form a thermal barrier structure; patterning the emitter material layer to form a patterned emitter; forming second MOSFET structures in the MOSFET region and heating the semiconductor layer.

Another method according to the present invention comprises providing the semiconductor layer; forming first MOSFET structures in a MOSFET region of the semiconductor layer; forming bipolar junction transistor structures including forming an extrinsic base material layer and an emitter material layer overlying the extrinsic base material layer in a bipolar junction transistor region of the semiconductor layer; forming a first material layer over the emitter material layer; patterning the first material layer to form a thermal barrier structure; patterning the emitter material layer to form a patterned emitter; patterning the extrinsic base material layer; forming second MOSFET structures in the MOSFET region and heating the semiconductor layer.

BRIEF DESCRIPTION OF THE DRAWINGS

The present invention can be more easily understood and the advantages and uses thereof more readily apparent when the following detailed description of the present invention is read in conjunction with the figures wherein.

Figure 1:
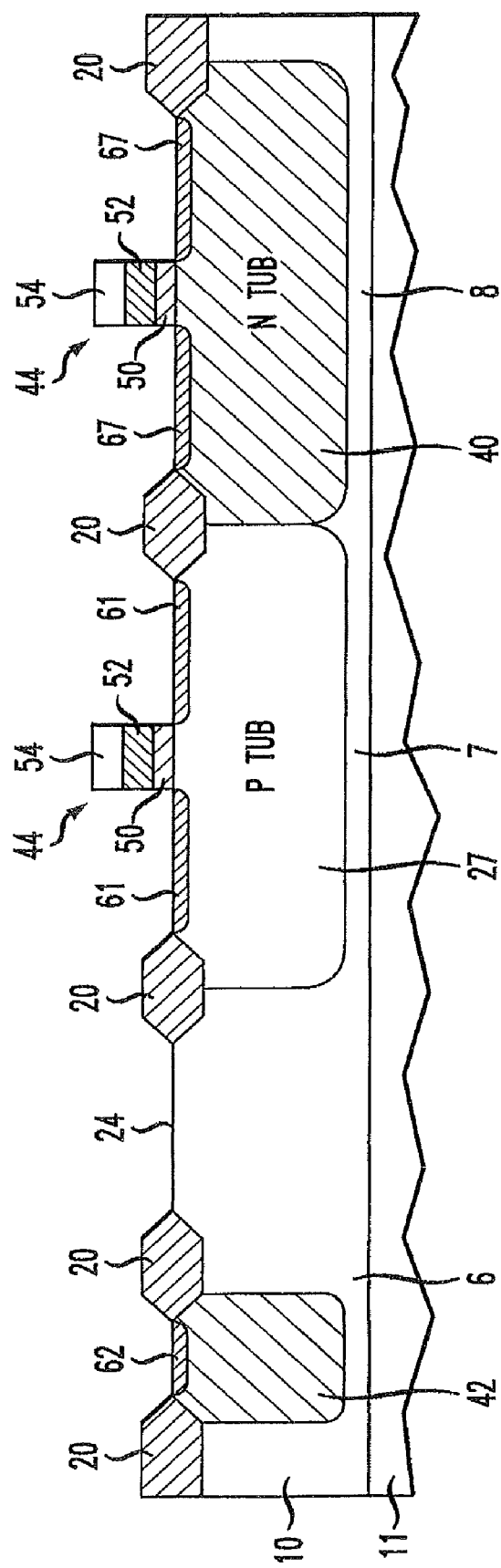
FIGS. 1-9 are cross-sectional illustrations of sequential processing steps for forming a single polysilicon layer bipolar junction transistor and metal-oxide semiconductor field effect transistors according to an embodiment of the present invention.

In accordance with common practice, the various described device features are not drawn to scale, but are drawn to emphasize specific features relevant to the invention. Reference characters denote like elements throughout the figures and text. The drawings are not necessarily to scale, emphasis instead being placed upon illustrating the principles of the invention.

DETAILED DESCRIPTION OF THE INVENTION

Before describing in detail an exemplary method for forming bipolar junction transistors and metal-oxide semiconductor field effect transistors according to a thermally stable BiCMOS process of the present invention, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

The teachings of the present invention apply to silicon NPN and PNP BJTS and to heterojunction bipolar transistors (HBTS) wherein the three material regions comprise silicon, silicon-germanium, gallium-arsenide or another material. The present application refers to an exemplary silicon-germanium NPN BJT to describe the invention.

The BiCMOS integration scheme of the present invention avoids the thermal budget and the layer erosion issues described above, without impairing the functionality of the bipolar junction transistors formed during the BiCMOS process.

A process sequence for forming single-layer polysilicon bipolar junction transistors (also referred to as implanted base bipolar junction transistors) and MOSFETS in a BiCMOS process is described below in conjunction with FIGS. 1-9, which show cross-sectional views of formed structures according to a sequence of exemplary fabrication steps. The process forms an NPN bipolar junction transistor in a region 6, an NMOSFET in a region 7 and a PMOSFET in a region 8 of a semiconductor layer 10 formed on a substrate 11. See FIG. 1. The NMOSFET and the PMOSFET form a complementary MOSFET (CMOS) pair.

To avoid performance degradation and electrical cross talk between devices, it is desirable to electrically isolate bipolar junction transistors and CMOS devices in the semiconductor layer 10. The exemplary process of FIG. 1 employs LOCOS (local oxidation of silicon) isolation regions 20, but in other embodiments shallow and deep trench isolation structures can be used alone or in combination with the LOCOS isolation regions 20. The LOCOS regions 20 are formed by oxidizing regions of an upper surface 24 of the p-type silicon semiconductor layer 10 that are exposed through openings formed in overlying material layers. The overlying material layers are then chemically stripped from the semiconductor layer 10 and a sacrificial screen silicon dioxide layer (not shown in FIG. 1) is formed on the upper surface 24.

Next, a first photoresist layer is deposited and patterned to form a mask (not shown in FIG. 1) through which a p-type dopant is implanted to form a p-tub 27 in the NMOS region 7 of the semiconductor layer 10. A wet clean process removes the first photoresist implant mask A second photoresist implant mask (not shown) is formed through which an n-type dopant is implanted, forming an n-tub 40 in the PMOS region 8 and a collector sinker region 42 for an NPN bipolar junction transistor device. The collector sinker region 42 bridges a later-formed collector surface region and a subcollector region.

A wet clean process removes the second photoresist implant mask. A gate oxide layer, a polysilicon layer (doped in situ or by an implant process) and a tungsten silicide layer are blanket deposited on the upper surface 24 of the semiconductor layer 10. The tungsten silicide layer provides improved ohmic contact (reducing sheet resistivity and contact resistance) between the gate electrode formed from the polysilicon layer and a later-formed overlying conductive via.

A silicon dioxide layer is deposited and patterned to form a hard mask for etching the gate silicon dioxide layer, the polysilicon layer and the tungsten silicide layer to form a gate stack 44 over the p-tub 27 (in the NMOS region 7) and the n-tub 40 (in the PMOS region 8). Each gate stack 44 comprises a gate oxide structure 50, a polysilicon structure 52 and a tungsten silicide structure 54. Other integration schemes with different gate and contact structures can be used, for example, a gate comprising in situ doped amorphous silicon and contacts comprising one of titanium silicide, cobalt silicide and nickel silicide.

Using a first patterned implant mask (not shown), n-type lightly doped drain regions 61 are formed in the p-tub 27 and an n-type lightly doped collector surface region 62 is formed in the bipolar junction transistor region 6 by implanting through the implant mask.

Using a second patterned implant mask (not shown), p-type lightly doped drain regions 67 are formed in the n-tub 40.

A TEOS (tetraethylorthosilicate) deposited silicon oxide layer 68 (having a thickness of about 18 nm in one embodiment) is formed overlying the semiconductor layer 10. See FIG. 2.

Using a subcollector mask that shields the NMOSFET region 7 and the PMOSFET region 8, a collector region 69 is implanted in the bipolar junction transistor region 6. To simplify the Figures, the collector sinker region 42 within the collector region 69 is not separately illustrated. It is to be understood that the collector region 69 can comprise several subregions, including the collector sinker region 42, a deep buried layer and a pedestal layer, each having different dopant concentrations.

Using an appropriate mask, a p-type base region 70 is formed in an upper region of the collector 69 by counterdoping with a p-type implant, e.g., boron.

Figure 3:
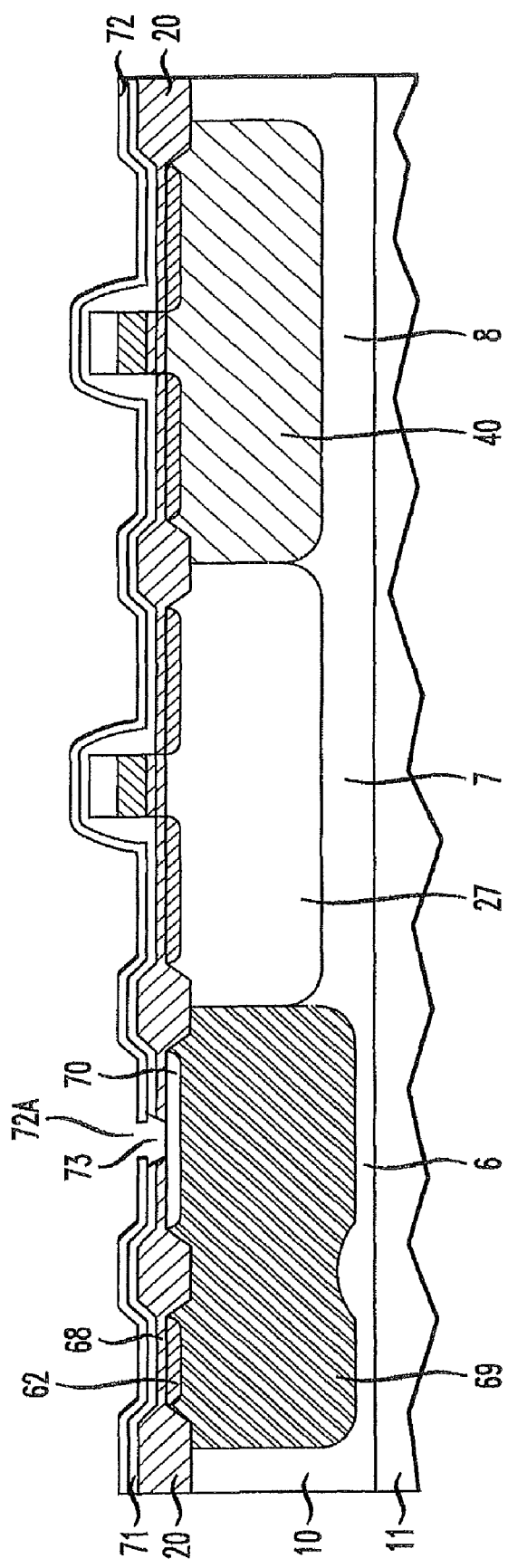

As shown in FIG. 3, a spacer TEOS-based silicon dioxide layer 71 is deposited over the semiconductor layer 10. In one embodiment the layer 71 is about 120 nm thick. A TEOS-based silicon dioxide hard mask layer 72 is deposited over the silicon dioxide layer 71 according to a PECVD process, for example, and patterned to form a hard mask for a subsequent wet etch step.

As is known by those skilled in the art, the various silicon dioxide layers referred to in the process steps of the present invention may be formed by depositing silane according to an LPCVD (low pressure chemical vapor deposition), a PECVD (plasma enhanced chemical vapor deposition) or a CVD (chemical vapor deposition) process or according to known TEOS-based processes.

A photoresist layer (not shown) is deposited and patterned for use in anisotropically etching an opening 72A in the hard mask layer 72. See FIG. 3. Using the opening 72A as a pattern, a wet etch process forms an emitter window 73 in the silicon dioxide layer 68 and the TEOS-based silicon dioxide layer 71.

Figure 4:
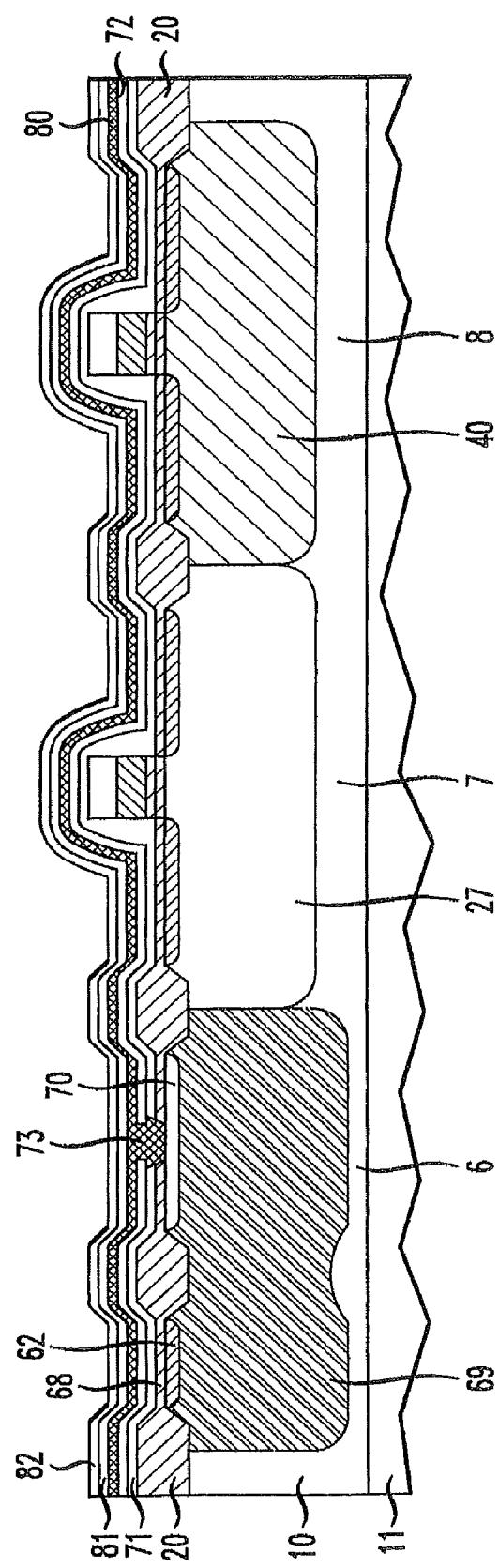

As illustrated in FIG. 4, an emitter polysilicon layer 80 having a thickness of about 240 nm is deposited over the substrate surface, filling the emitter window 73. The polysilicon layer 80 is implanted (or doped in-situ) with arsenic or another n-type dopant.

The wafer is cleaned using an RCA cleaning process. A silicon oxynitride layer 81 (having a thickness of about 30 nm to 60 nm) is deposited over the polysilicon layer 80 as illustrated in FIG. 4. According to an exemplary embodiment, the silicon oxynitride layer 81 is deposited according to a PECVD process using silane (SiH4) at 125 SCCM, ammonia (NH3) at 350 SCCM and helium at 2500 SCCM. Any of these parameters can be varied by at least 10%.

Those skilled in the art recognize that other processes can be used to deposit the silicon oxynitride layer 81 and other materials can be used in lieu of the silicon oxynitride. For example, silicon nitride or silicon carbide can be substituted for silicon oxynitride. Deposition of silicon nitride uses the same process parameters as the deposition of silicon oxynitride, except nitrogen dioxide (NO2) is substituted for ammonia at about the same flow rate.

A silicon dioxide hard mask layer 82 is deposited over the silicon oxynitride layer 81. In one embodiment the hard mask layer 82 is about 300 nm thick, but according to certain prior art processes the thickness is increased to about 600 nm to limit erosion of the polysilicon emitter layer during subsequent etch steps. The increased thickness is advantageously avoided according to the process of the present invention.

Figure 5:
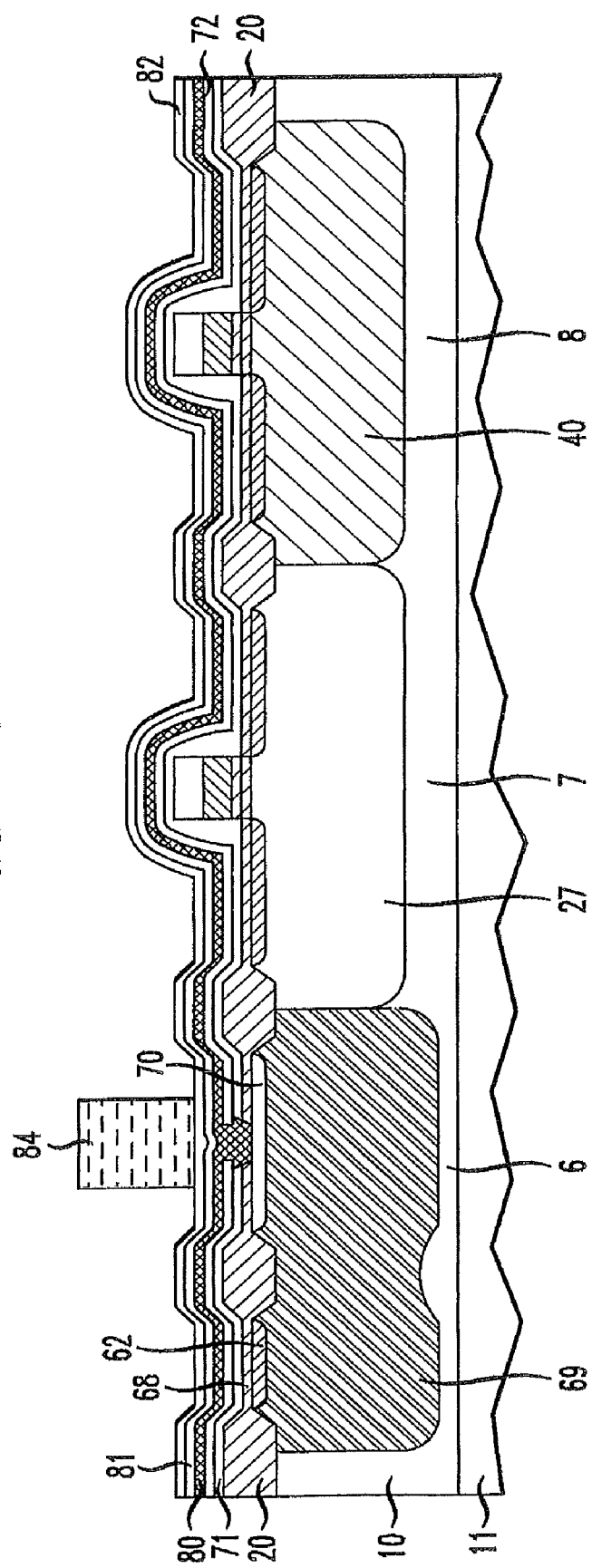

Next, a photoresist layer is deposited and patterned to form a mask structure 84 as illustrated in FIG. 5. During the step of photolithographically exposing the photoresist layer, prior to patterning the layer, the silicon oxynitride advantageously functions as an antireflective coating to improve the accuracy of the photolithographic patterning process.

Using the mask structure 84, the hard mask layer 82 is etched (patterned) to form a hard mask structure 82A. See FIG. 6. Preferably, the hard mask layer 82 is etched according to a plasma etching process using CHF3 at about 54 SCCM, CF4 at about 27 SCCM and argon at about 20 SCCM. The chamber pressure is about 120 mTorr and the RF power is about 900 W. Any of these parameters can be varied by at least 10%. Those skilled in the art recognize that other etch materials, parameters and processes can be employed to etch the hard mask layer 82. After etching the hard mask layer 82, a plasma resist strip and clean process removes the mask structure 84.

Figure 6:
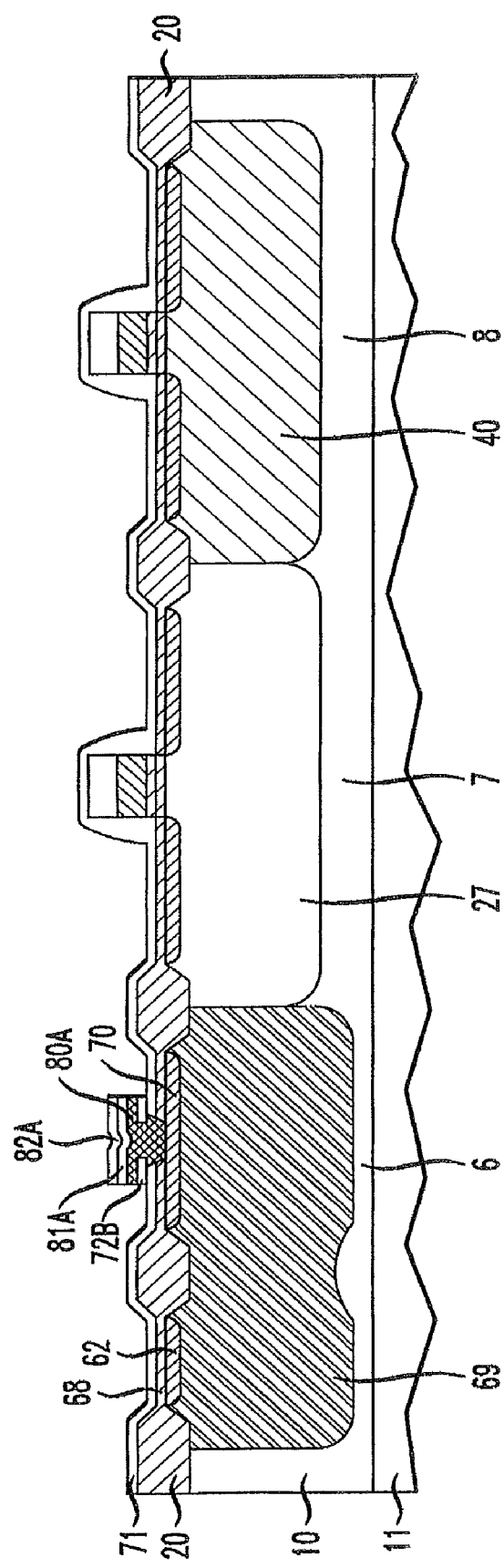
Figure 7:
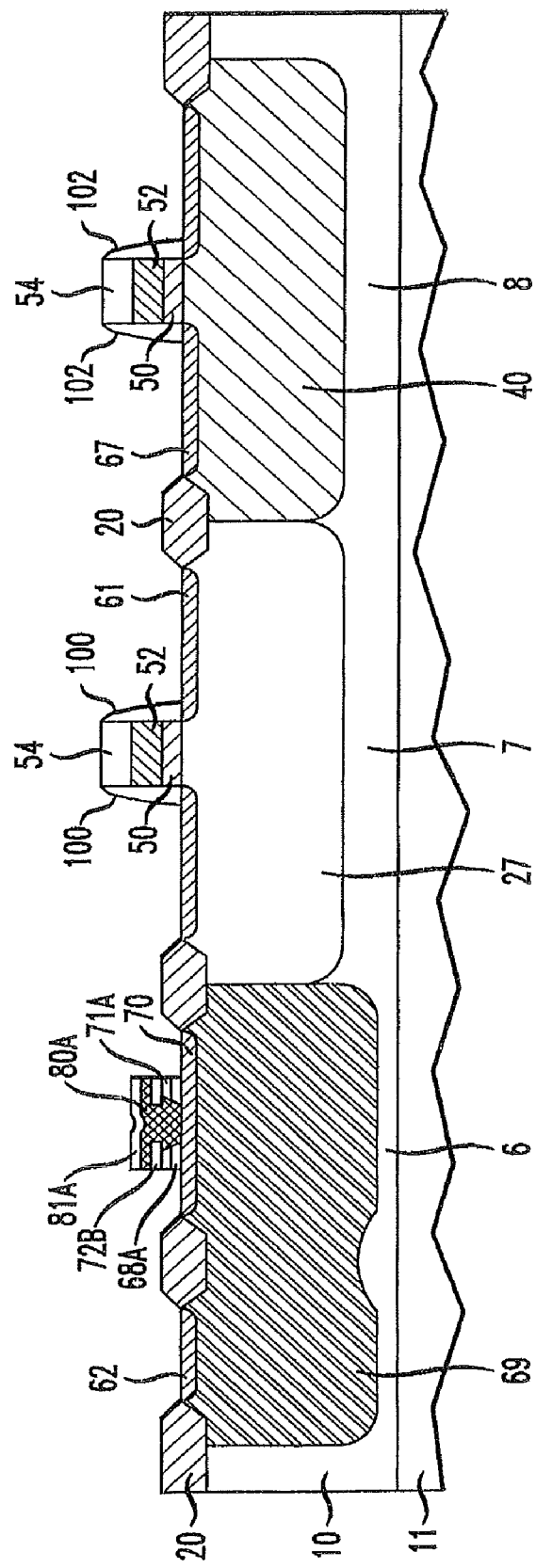
Figure 8:
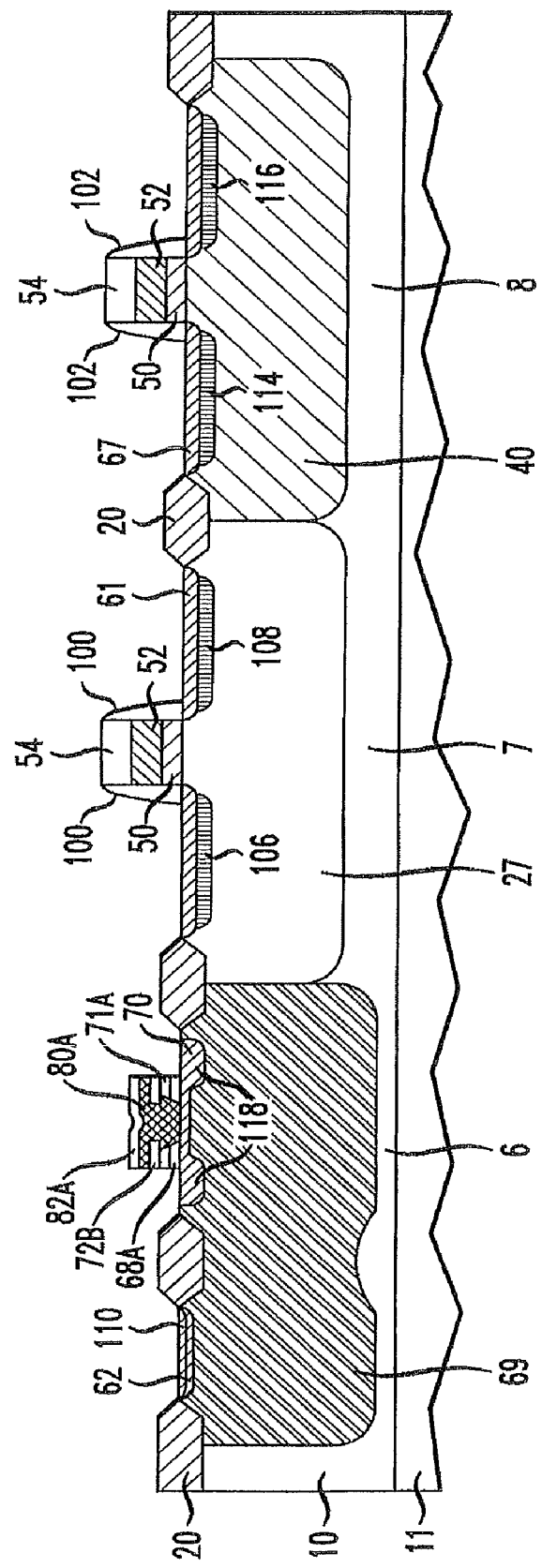

An etch process using the hard mask structure 82A defines a silicon oxynitride structure 81A formed from the silicon oxynitride layer 81, an emitter polysilicon structure 80A formed from the emitter polysilicon layer 80 and a hard mask structure 72B formed from the hard mask layer 72, as illustrated in FIG. 6. An etch chemistry comprising a plasma-containing fluorine material etches the silicon oxynitride layer 81, and an etch chemistry comprising a plasma-containing chlorine material and hydrogen bromine etches the emitter polysilicon layer 80 and the hard mask layer 72.

According to an exemplary embodiment, the silicon oxynitride layer 81 is etched (according to the pattern in the hard mask structure 82A) using a plasma etch process employing C2F6 at about 100 SCCM and oxygen at about 10 SCCM. The chamber pressure is about 120 mTorr and an RF power of about 600 W is supplied. Any of these parameters can be varied by at least 10%. Those skilled in the art recognize that other etch materials, parameters and processes can be employed to etch the silicon oxynitride layer 81.

According to an exemplary embodiment, the emitter polysilicon layer 80 and the hard mask layer 72 are etched (according to the pattern in the hard mask structure 82A) using a plasma etch process employing chlorine at about 50 SCCM, hydrogen bromine at about 150 SCCM and a mixture of helium and oxygen at about 10 SCCM. The chamber pressure is about 10 mTorr. For an etch tool comprising two power supplies, an upper power is about 250 W and a lower power is about 100 W. Any of these parameters can be varied by at least 10%. Those skilled in the art recognize that other etch materials, parameters and processes can be employed to etch the emitter polysilicon layer 80 and the hard mask layer 72.

The substrate 11 is cleaned and a plasma resist strip and clean process removes the hard mask structure 82A, during which the silicon oxynitride structure 81A acts an etch stop to avoid etching the emitter polysilicon structure 80A. See FIG. 7.

Gate stack spacers 100 for the NMOSFET device in the region 7 and gate stack spacers 102 for the PMOSFET device in region 8 are formed by anisotropically etching the TEOS-based silicon dioxide layers 68 and 71. See FIG. 7. During the gate stack etch process material layers formed underlying the emitter polysilicon structure 80A include silicon oxide structures 71A and 68A. After forming the gate stack spacers 100 and 102, the substrate 11 is cleaned.

A photoresist layer (not illustrated) is deposited and patterned to form openings therein. Implanting arsenic through the openings forms n+ source/drain regions 106 and 108 (see FIG. 8) into the p-tub 27 for the NMOSFET in the region 7 and forms an n+ collector contact 110 in the bipolar junction transistor collector region 69. The relatively high dopant concentration of the collector contact 110 minimizes contact resistance with a subsequently-formed overlying collector contact.

A high dose of a p-type (p+) dopant is implanted through a patterned mask (not illustrated) into the n-tub 40 to forms source/drain regions 114 and 116 into the n-tub 40 for the PMOSFET in the region 8. Simultaneously, an extrinsic base region 118 of the NPN bipolar junction transistor is formed by implanting the p-type dopant.

The substrate 11 is annealed to repair crystal lattice damage resulting from collisions between the n-type and p-type implanted dopants and the lattice atoms, and to electrically activate the implanted dopants. The annealing is performed at about 1000° C. for about 20 seconds.

During the annealing step the silicon oxynitride structure 81A acts as a thermal and a diffusion barrier that limits out-diffusion of dopants from the emitter polysilicon structure 80A. In particular, the thermal barrier limits the temperature of the emitter polysilicon structure 81A to minimize dopant diffusion from the emitter 80A to the base 118.

The silicon oxynitride structure 81A is removed during a wet or dry etch. An exemplary dry etch comprises a plasma etch process employing C2F6 at about 100 SCCM and oxygen at about 10 SCCM. The chamber pressure is about 120 mTorr and an RF power of about 600 W is supplied. Any of these parameters can be varied by at least 10%. Those skilled in the art recognize that other etch materials, parameters and processes can be employed to etch the silicon oxynitride layer 81.

The silicon oxynitride structure 81A can also be removed using a wet etch process as known by those skilled in the art.

Figure 9:
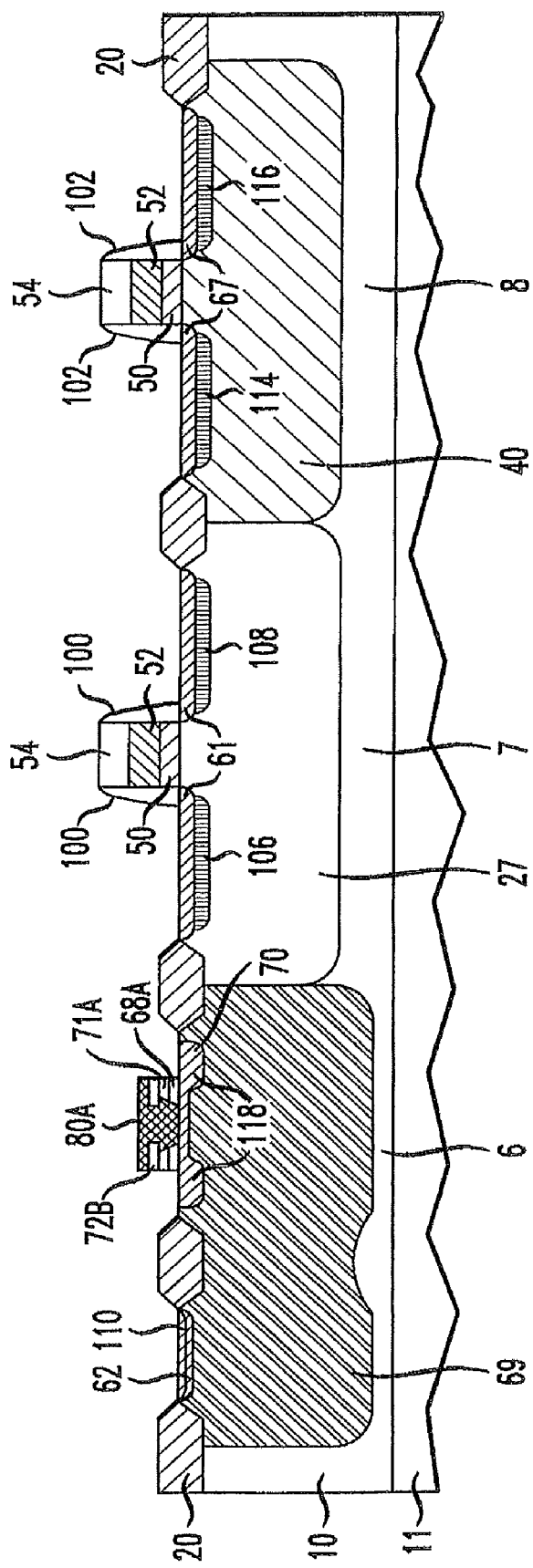
Figure 10:
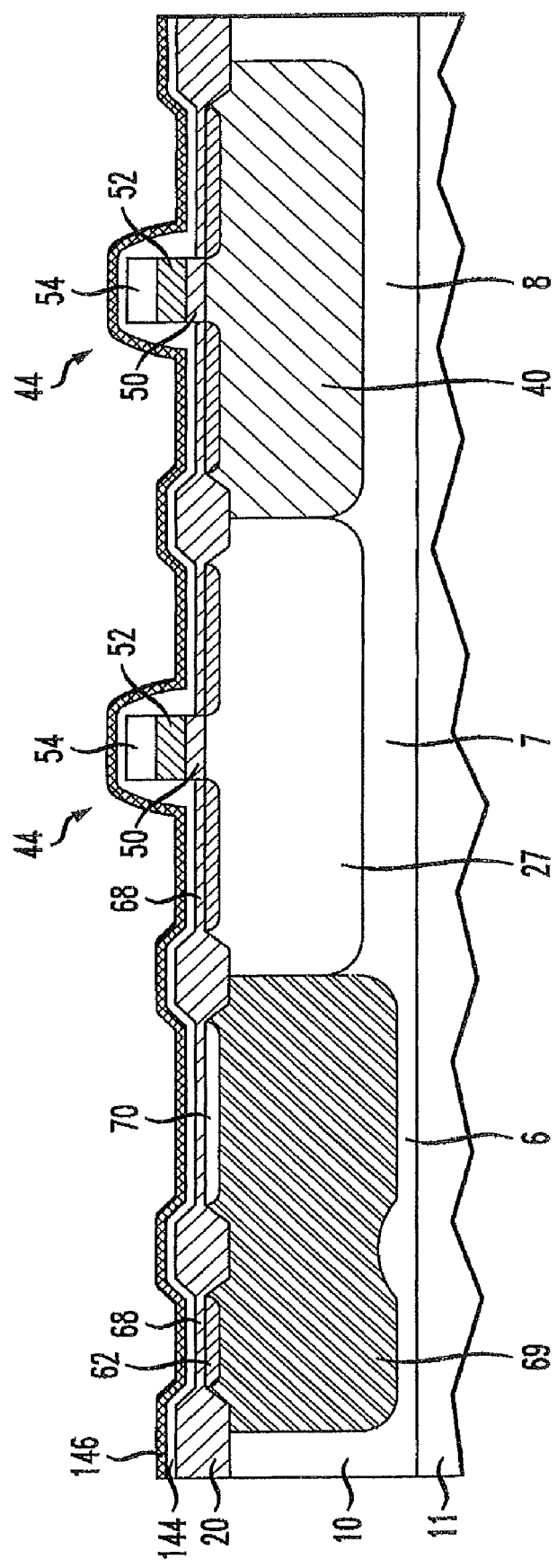
FIGS. 10-22 are cross-sectional illustrations of sequential processing steps for forming a double polysilicon layer bipolar junction transistor and metal-oxide semiconductor field effect transistors according to another embodiment of the present invention.

FIG. 9 illustrates the final device structure. Overlying alternating dielectric layers and conductive layers are formed to interconnect the doped regions formed in the semiconductor layer 10.

In another embodiment (not illustrated), the silicon oxynitride structure 81A is not removed and the alternating dielectric layers and conductive layers are formed thereover. It is necessary in this embodiment to form an opening in the silicon oxynitride structure 81A to permit electrical contact to the underlying emitter polysilicon structure 80A.

Figure 2:
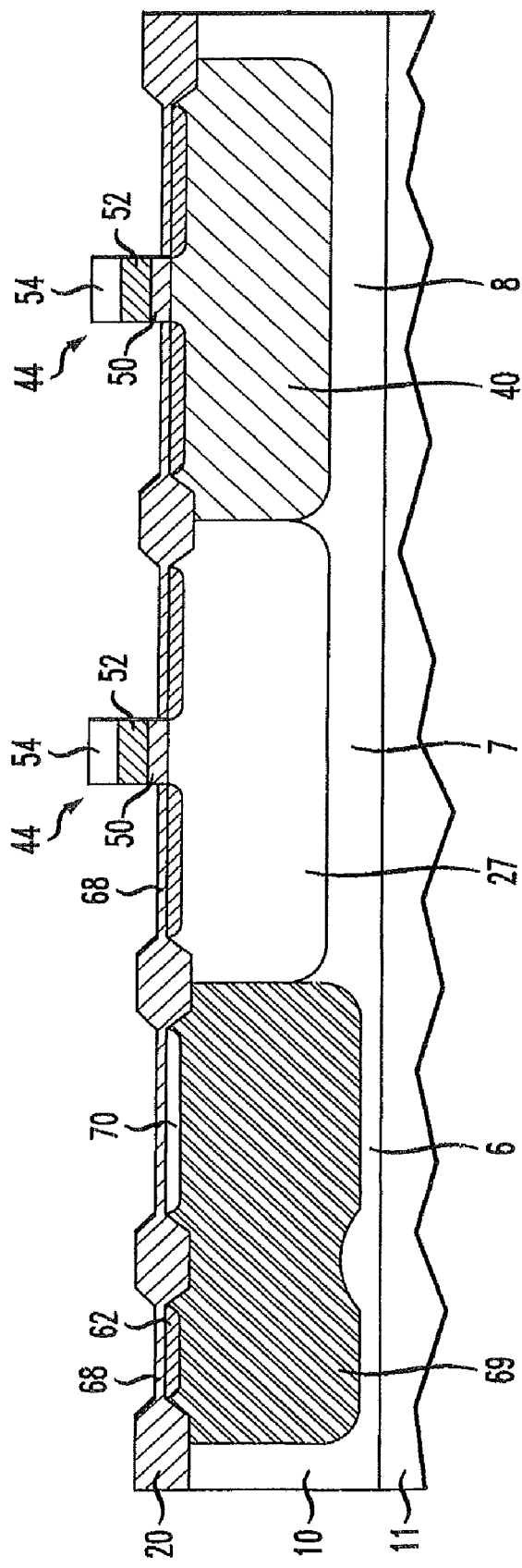

An exemplary double-polysilicon BiCMOS process (forming an NPN bipolar junction transistor comprising two polysilicon layers, one layer for the emitter and one layer for the extrinsic base) includes the process steps set forth above and illustrated in FIGS. 1 and 2 (with the exception that the intrinsic base 70 illustrated in FIG. 2 is not formed according to the double-polysilicon process) and the process steps illustrated in FIGS. 10-22, the latter illustrating cross-sectional views of the formed structures according to sequential processing steps.

With the initial steps set forth in FIGS. 1 and 2 above completed (with the exception that the intrinsic base 70 illustrated in FIG. 2 is not formed according to the double-polysilicon process) a TEOS-based silicon dioxide layer 144 and a base polysilicon layer 146 are formed on an upper surface of the semiconductor layer 10. The base polysilicon layer 146 is heavily doped (in situ or implanted) with boron. An extrinsic base is formed from the doped base polysilicon layer 146 as described below.

Figure 11:
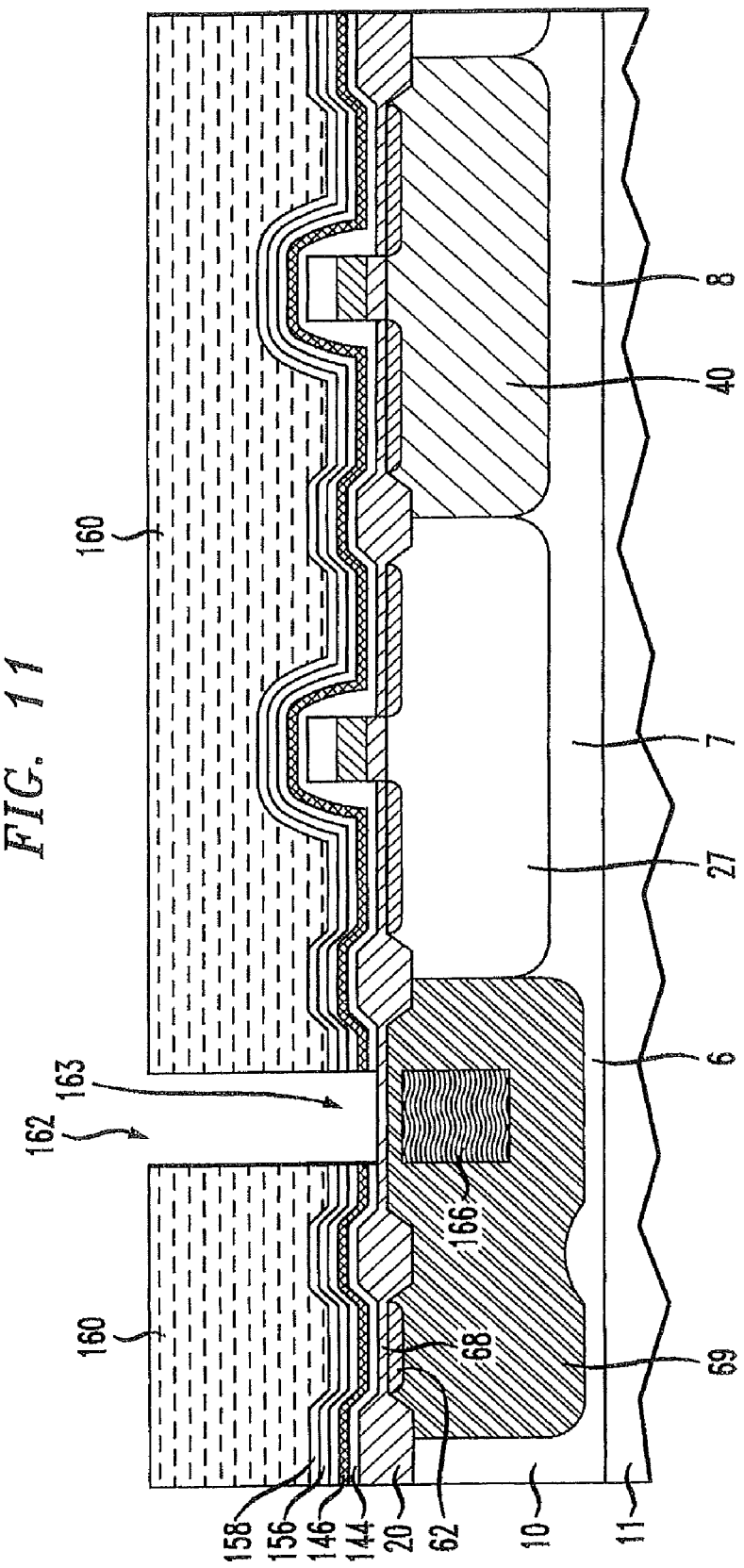

As illustrated in FIG. 11, a silicon nitride layer 156 and a silicon dioxide layer 158 (in one embodiment the latter formed according to a TEOS-based deposition process) are deposited in a stacked relation over the base polysilicon layer 146. A patterned photoresist layer 160 defines a window 162 through which the silicon dioxide layer 158, the silicon nitride layer 156 and the base polysilicon layer 146 are anisotropically etched, stopping on the TEOS layer 144. A lower region of the window 162 is referred to as an emitter window 163. In certain bipolar junction transistor embodiments an implant may be made through the window 162 to create a collector region 166.

Figure 12:
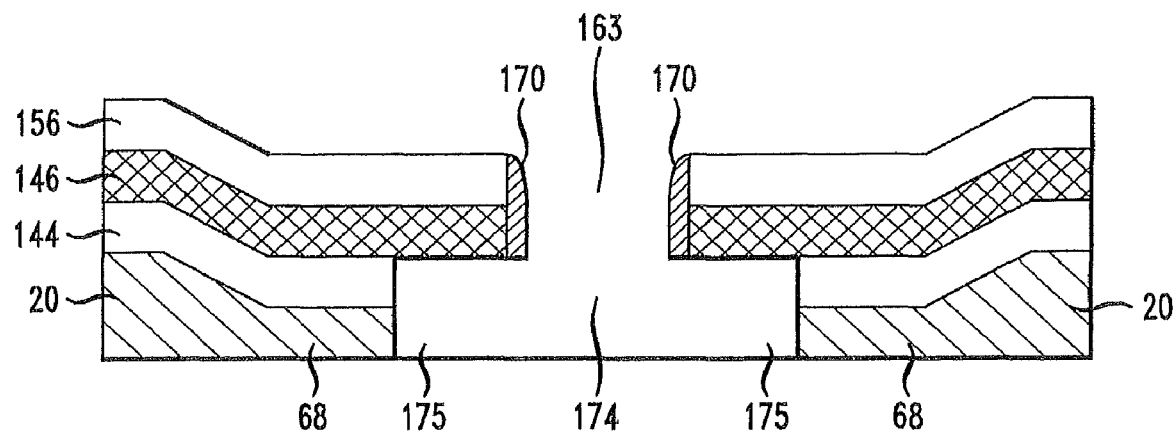

The photoresist layer 160 is removed and a layer of silicon nitride is deposited overlying the silicon dioxide layer 158 and anisotropically etched to form sidewall spacers 170. See FIG. 12. A wet etch process removes the silicon dioxide layer 158 across the semiconductor layer 10 and removes regions of the silicon dioxide layers 68 and 144 within the emitter window 163. Removal of these material layers forms a primary cavity 174 having laterally disposed recesses 175 within the emitter window 163, as illustrated in FIG. 12.

An intrinsic base and cap region, both referred to by a reference character 176 (see FIG. 13), are formed in the cavities 174 and recesses 175 during a silicon-germanium epitaxial growth step. Voids 177 may form in regions where the silicon-germanium does not grow.

Figure 14:
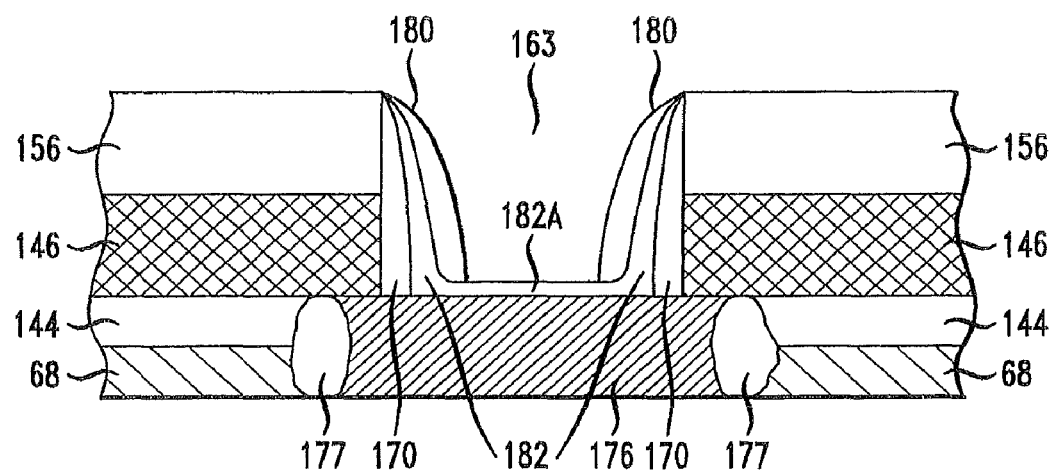
Figure 13:
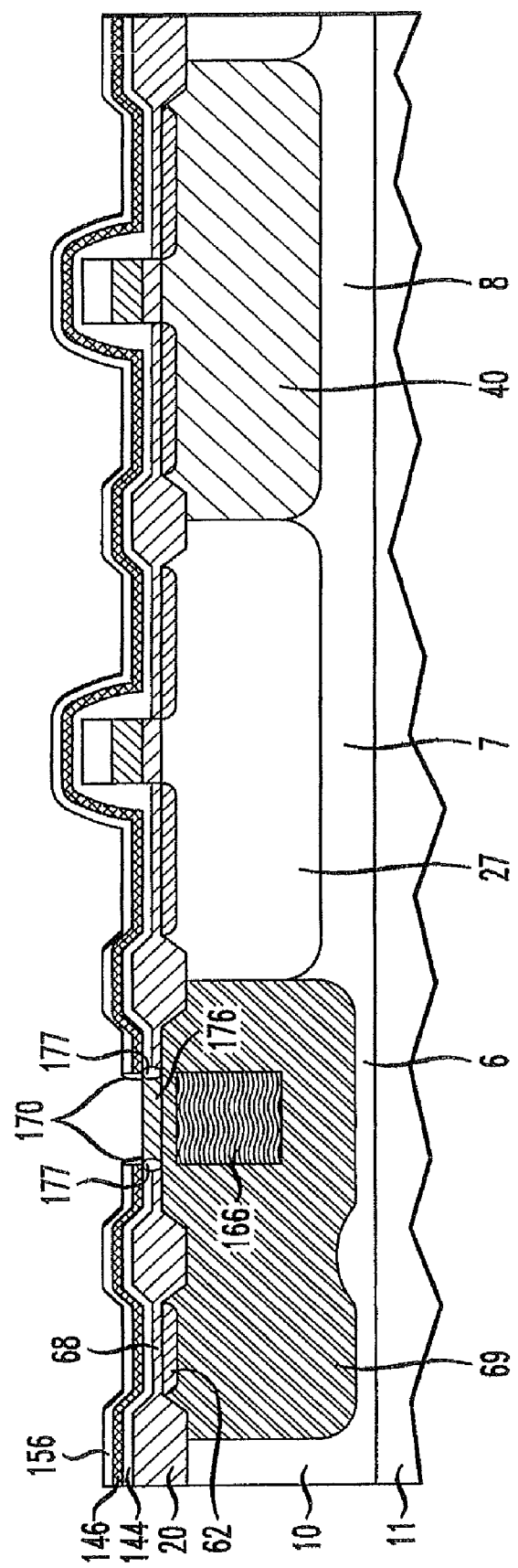
Figure 15:
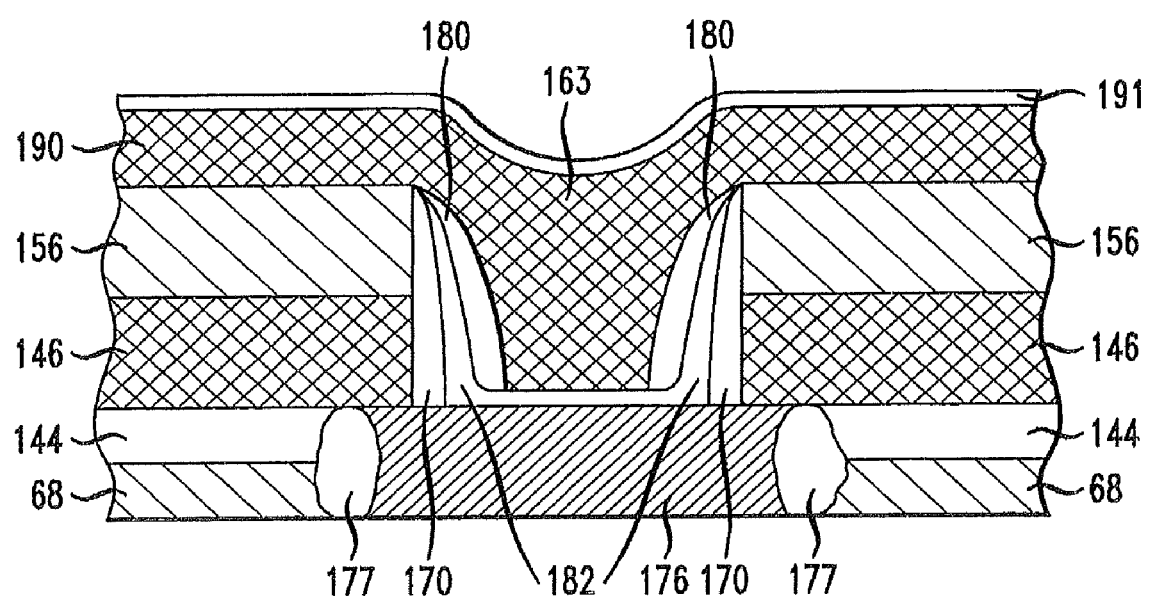

A silicon nitride spacer 180 and an underlying silicon oxide spacer 182 are formed in the window 163 as illustrated in the close-up view of FIG. 14. The spacers, which isolate a later-formed emitter and extrinsic base, are formed by depositing a silicon oxide layer and an overlying silicon nitride layer. The layers are anisotropically etched back to form the spacers 180 and 182, with the etch stopping on a region of the silicon oxide layer 182A formed on an upper surface of the intrinsic base and cap region 176. In another embodiment the spacers 180 and 182 are not required if the previously formed spacers 170 provide sufficient isolation between the extrinsic base and the emitter. Following spacer formation, regions of the TEOS silicon dioxide layer 182A overlying the upper surface of the intrinsic base and cap region 173 are removed by a wet etch process.

A polysilicon layer 190 having a thickness of about 240 nm is blanket deposited. See FIGS. 15 and 16. The layer 190 is later etched to define the bipolar junction transistor emitter. The polysilicon layer 190 may be implanted or doped in-situ with arsenic or another n-type dopant.

The wafer is cleaned using an RCA cleaning process. A silicon oxynitride layer 191 having a thickness between about 30 nm and about 60 nm is deposited over the polysilicon layer 190. See the resulting structure illustrated in FIGS. 15 and 16. In an exemplary embodiment, the silicon oxynitride layer 191 is deposited according to a PECVD (plasma enhanced chemical vapor deposition) using silane (SiH4) at 125 SCCM and ammonia (NH3) at 350 SCCM and helium at 2500 SCCM. Any of these parameters can be varied by at least 10%. Those skilled in the art recognize that other processes can be used to deposit the silicon oxynitride layer 191.

In other embodiments, silicon nitride or silicon carbide is substituted for silicon oxynitride. Deposition of silicon nitride uses the same process parameters as the deposition of silicon oxynitride, except nitrogen dioxide (NO2) is substituted for ammonia at about the same flow rate.

According to a preferred embodiment, a hard mask silicon dioxide layer (having a thickness of about 300 nm and formed according to a plasma-enhanced TEOS process) is deposited overlying the silicon oxynitride layer 191. A photoresist layer (not shown) is deposited over the hard mask layer and patterned.

During photolithographic exposure of the photoresist layer, the silicon oxynitride advantageously functions as an antireflective coating to improve the accuracy of the exposure process, which in turn improves the dimensional accuracy of the patterned hard mask, and the patterned silicon oxynitride layer 191 and the patterned emitter polysilicon layer 190 formed using the patterned hard mask.

Figure 16:
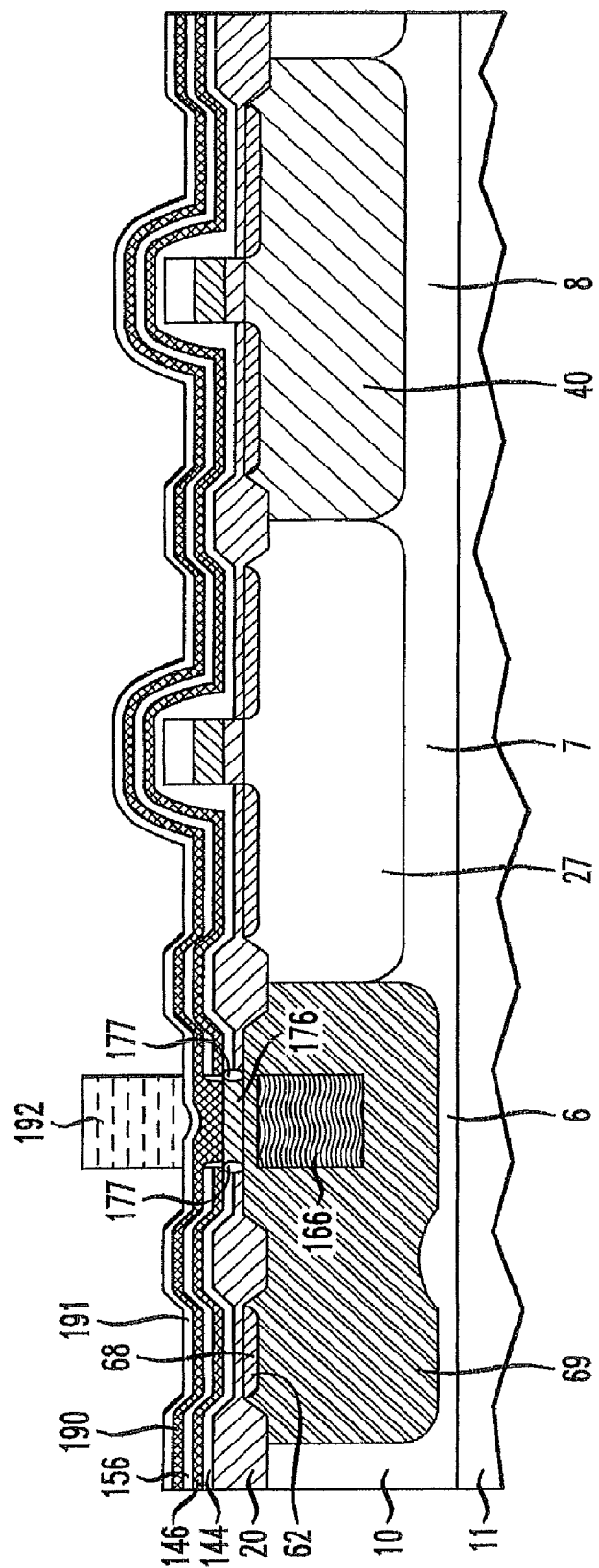

The photoresist pattern is transferred to the hard mask silicon dioxide layer by etching the hard mask layer to form a patterned hard mask 192 (see FIG. 16). Preferably, the hard mask layer is etched according to a plasma etching process using CHF3 at about 54 SCCM, CF4 at about 27 SCCM and argon at about 20 SCCM. The chamber pressure is about 120 mTorr and the RF power is about 900 W. Any of these parameters can be varied by at least 10%. Those skilled in the art recognize that other etch materials, parameters and processes can be employed to etch the hard mask layer.

After forming the patterned hard mask 192 a plasma resist strip and clean process removes the patterned photoresist.

Figure 17:
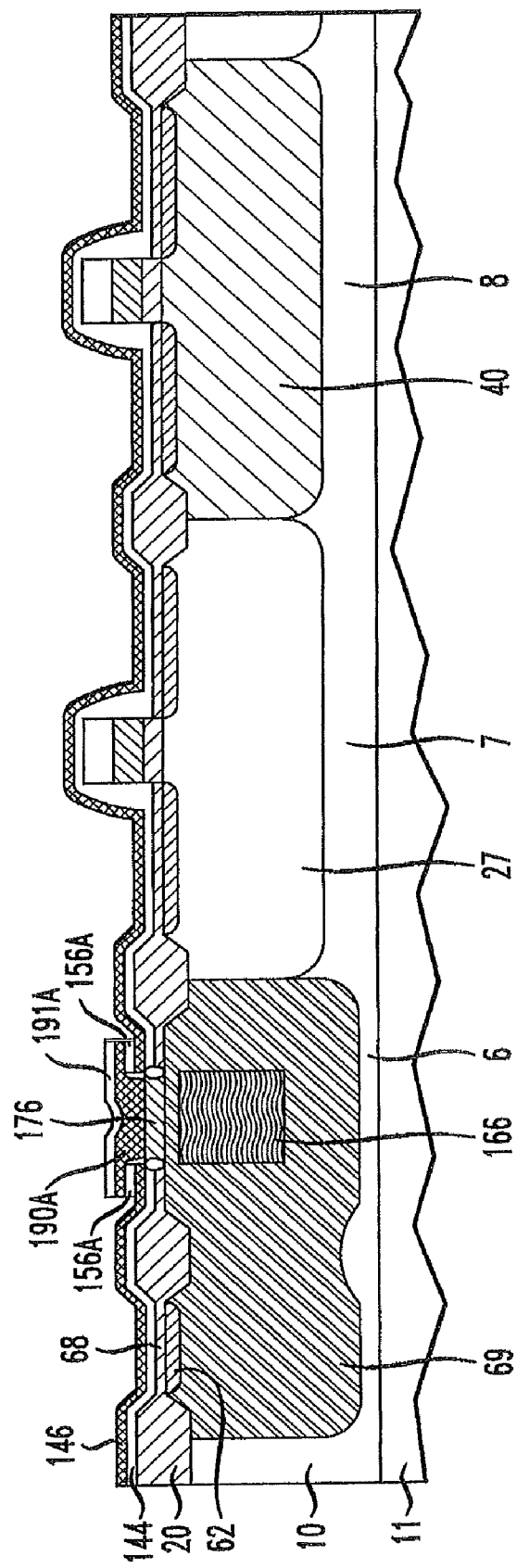
Figure 18:
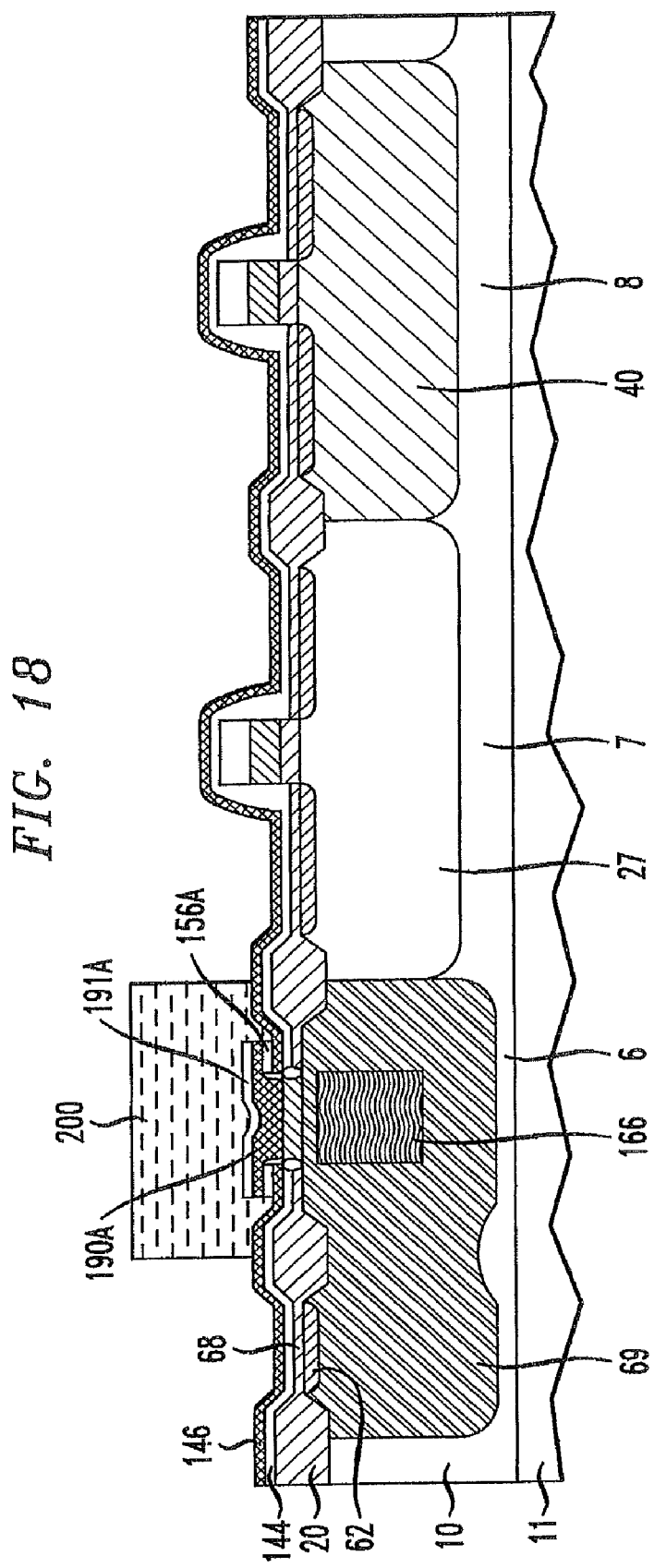

Using the patterned hard mask 192, the silicon oxynitride layer 191 and the emitter polysilicon layer 190 are etched to form a silicon oxynitride structure 191A and a polysilicon emitter structure 190A as illustrated in FIG. 17. In one embodiment, an etch chemistry comprising a plasma-containing fluorine material etches the silicon oxynitride layer 191, and an etch chemistry comprising a plasma-containing chlorine material and hydrogen bromine etches the emitter polysilicon layer 190.

According to an exemplary embodiment, the silicon oxynitride layer 191 is etched according to the pattern in the patterned hard mask 192 using a plasma etch process employing C2F6 at about 100 SCCM and oxygen at about 10 SCCM. The chamber pressure is about 120 mTorr and an RF power of about 600 W is supplied. Any of these parameters can be varied by at least 10%. Those skilled in the art recognize that other etch materials, parameters and processes can be employed to etch the silicon oxynitride layer 191. The resulting silicon oxynitride structure 191A is illustrated in FIG. 17.

According to an exemplary embodiment, the emitter polysilicon layer 190 is etched according to the pattern in the patterned hard mask 192 using a plasma etch process employing chlorine at about 50 SCCM, hydrogen bromine at about 150 SCCM and a mixture of helium and oxygen at about 10 SCCM. The chamber pressure is about 10 mTorr. For an etch tool comprising two power supplies, an upper power is about 250 W and a lower power is about 100 W. Any of these parameters can be varied by at least 10%. Those skilled in the art recognize that other etch materials, parameters and processes can be employed to etch the emitter polysilicon layer 190. The resulting emitter polysilicon structure 190A is illustrated in FIG. 17.

The silicon nitride layer 156 is etched according to any one of several known silicon nitride etch processes to form the silicon nitride structure 156A of FIG. 17.

The substrate 11 is cleaned and a plasma resist strip and clean process removes the patterned hard mask 192. During this resist strip and clean process, the silicon oxynitride structure 191A acts an etch stop to avoid etching of the polysilicon emitter structure 190A.

In an alternative embodiment, a photoresist layer is patterned to form a mask for directly etching (i.e., without using a hard mask layer) portions of the silicon oxynitride layer 191, the polysilicon layer 190 and the silicon nitride layer 156 to form the resulting structures as illustrated in FIG. 17.

Figure 19:
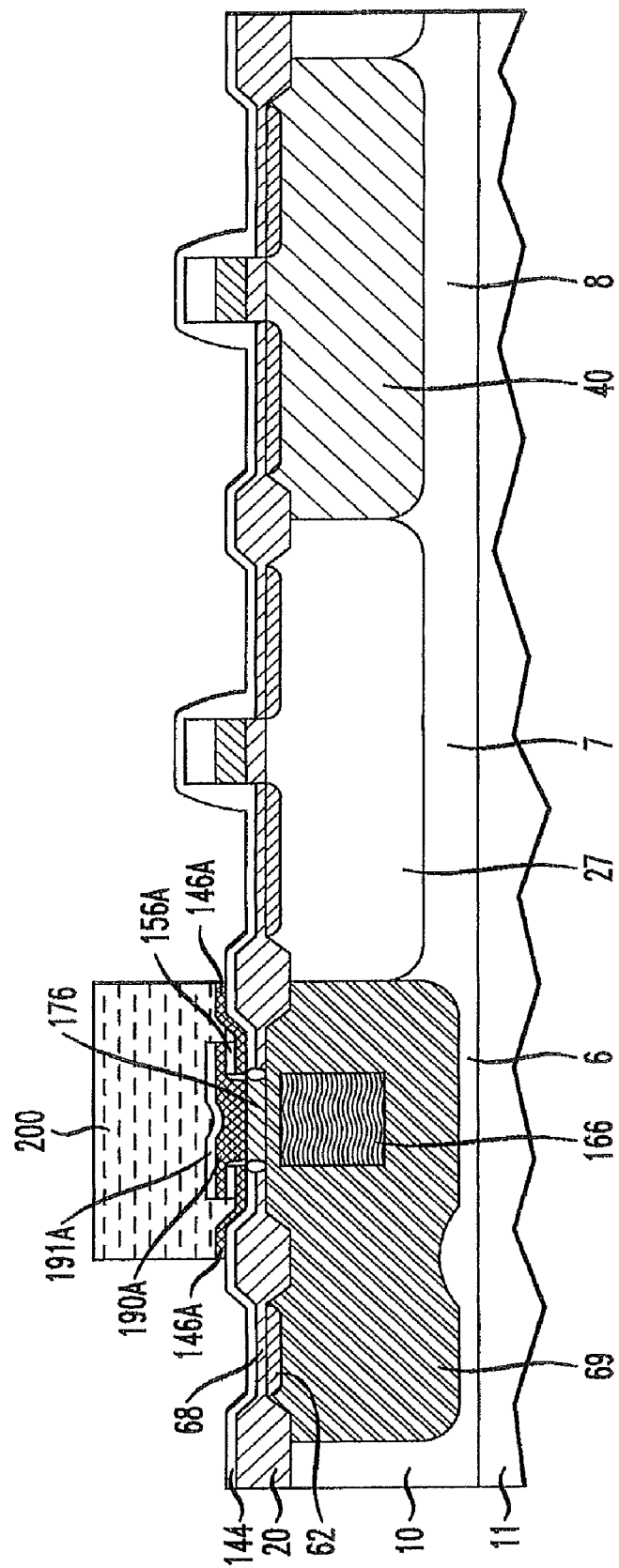
Figure 20:
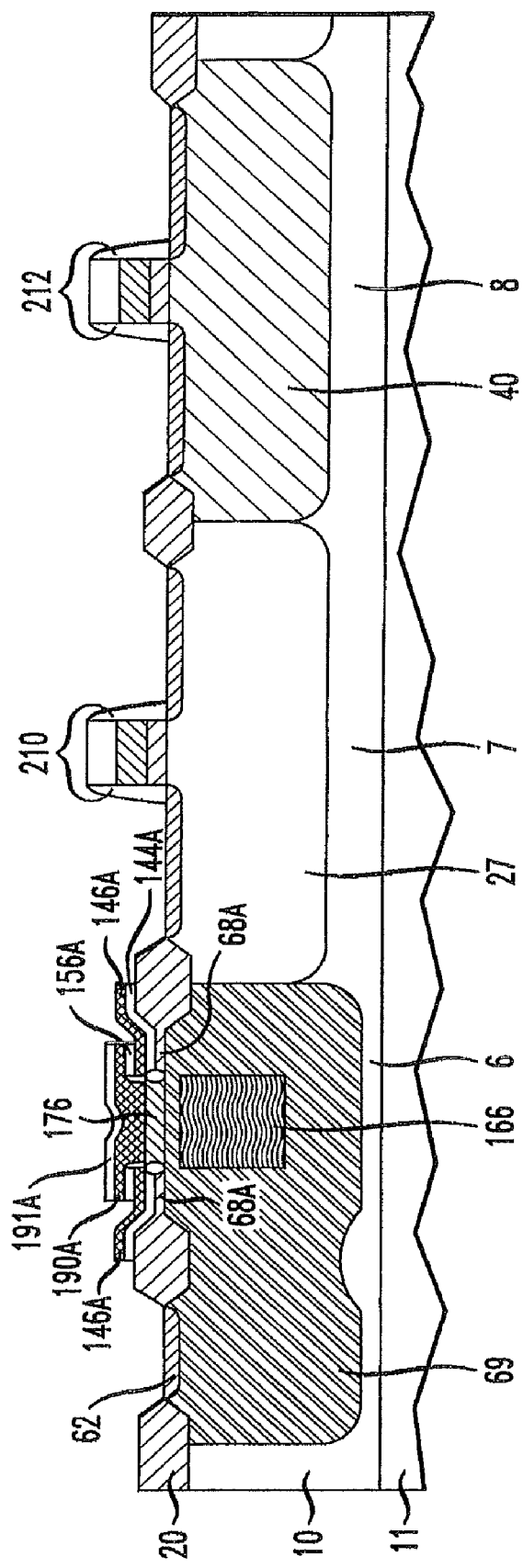
Figure 21:
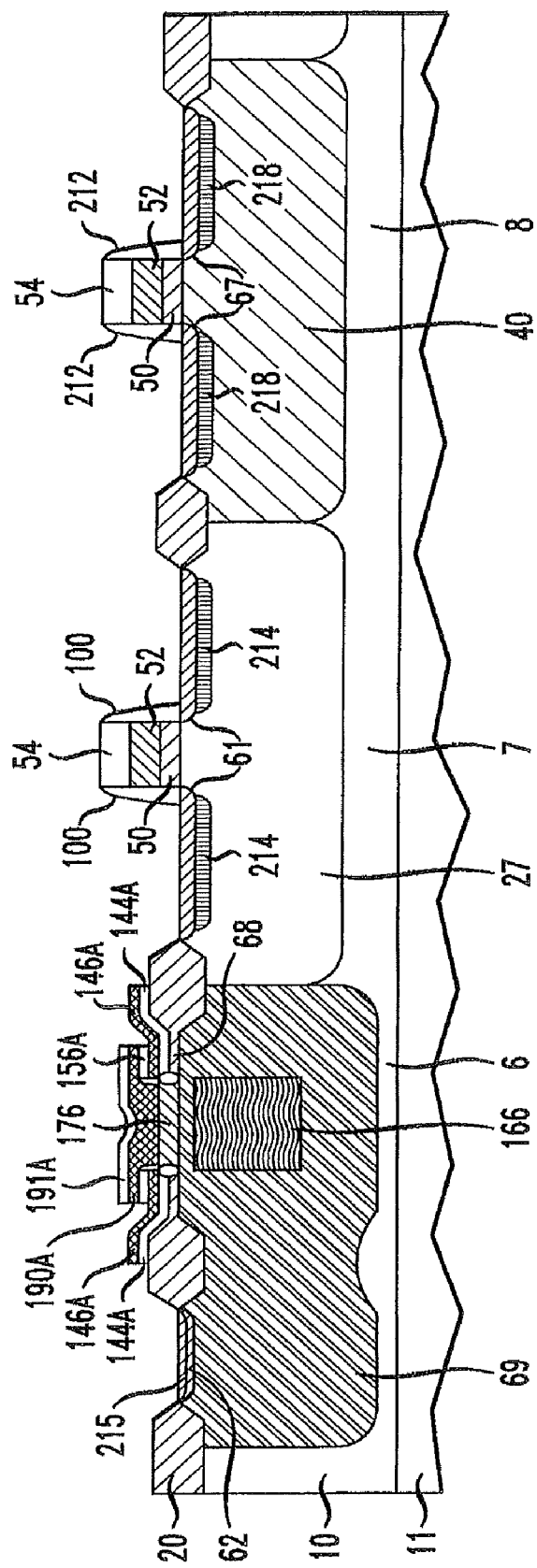

A photoresist layer is patterned to form a mask 200 (see FIG. 18) for etching regions of the base polysilicon layer 146 to form extrinsic base polysilicon structures 146A illustrated in FIG. 19.

The base polysilicon photoresist mask 200 is removed during a plasma resist strip and clean step. The TEOS-based silicon dioxide layer 144 and the silicon dioxide layer 68 are anisotropically etched to form gate stack spacers 210 for the NMOSFET device in the region 7 and gate stack spacers 212 for the PMOSFET device in the region 8. See FIG. 20. Structures 144A of the TEOS-based silicon dioxide layer 144 and structures 68A of the silicon dioxide layer 68 remain underlying the extrinsic base polysilicon structures 146A. After forming the gate stack spacers 210 and 212 the substrate 11 is cleaned.

N+ source/drain regions 214, an n+ ohmic collector contact region 215 and p+ source/drain regions 218 are formed as described above in conjunction with FIGS. 8 and 9.

The substrate 11 is annealed to repair crystal lattice damage resulting from collisions between the implanted n-type and p-type dopants and the lattice atoms, and also to electrically activate the implanted dopants. The annealing, typically comprising a rapid thermal anneal, is performed at about 1000° C. for about 20 seconds.

During the annealing step the silicon oxynitride structure 191A acts as a thermal and a diffusion barrier that limits out-diffusion of dopants from the emitter polysilicon structure 190A. In particular, the thermal barrier limits the temperature of the emitter polysilicon structure 190A to minimize dopant diffusion from the emitter to the intrinsic base 176 and to the extrinsic base structures 146A.

The silicon oxynitride structure 191A is removed during a wet or dry etch step. An exemplary dry etch comprises a plasma etch process employing C2F6 at about 100 SCCM and oxygen at about 10 SCCM. The chamber pressure is about 120 mTorr and an RF power of about 600 W is supplied. Any of these parameters can be varied by at least 10%. Those skilled in the art recognize that other etch materials, parameters and processes can be employed to etch the silicon oxynitride structure 191A. Wet etch processes for removing the silicon oxynitride structure 191A are known in the art.

Figure 22:
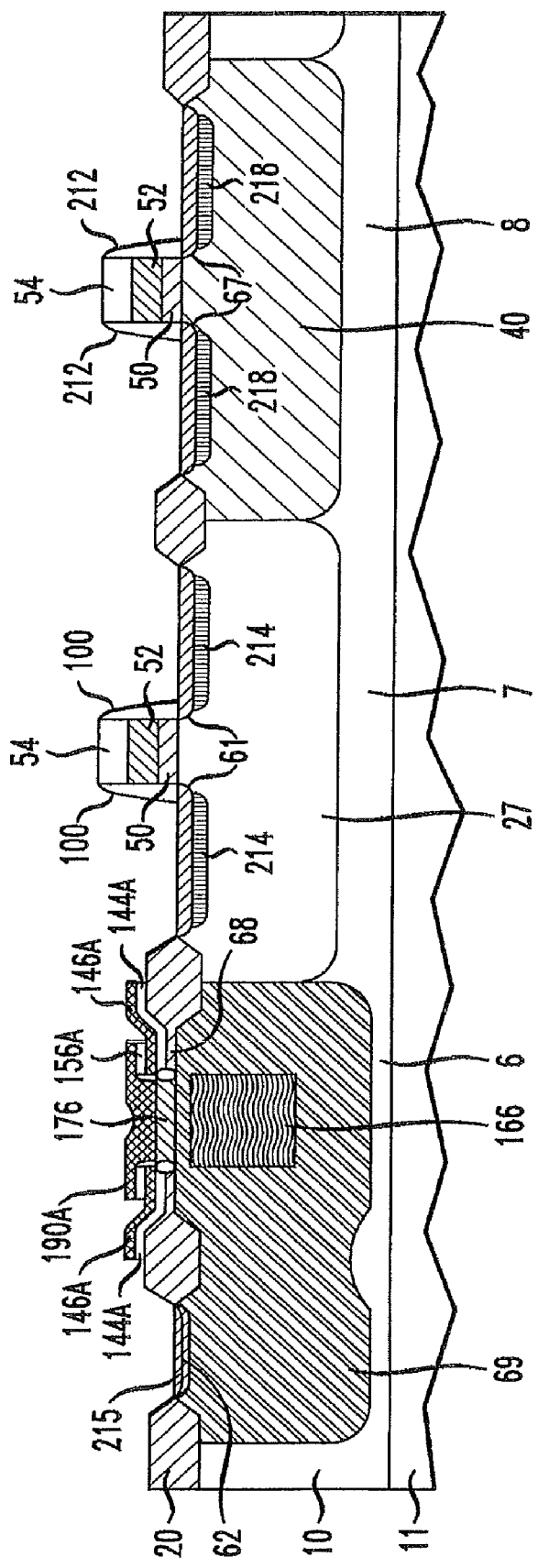

FIG. 22 illustrates the final device structure. Alternating dielectric and conductive layers are formed overlying the substrate 11 to interconnect the doped regions within the substrate 11.

In another embodiment (not illustrated), the silicon oxynitride structure 191A is not removed and the alternating dielectric layers and conductive layers are formed thereover. It is necessary in this embodiment to form an opening in the silicon oxynitride structure 191A to permit electrical contact to the underlying emitter polysilicon structure 190A.

While the present invention has been described with reference to preferred embodiments, it will be understood by those skilled in the art that various changes may be made and equivalent elements may be substituted for the elements thereof without departing from the scope of the invention. The scope of the present invention further includes any combination of elements from the various embodiments set forth herein. In addition, modifications may be made to adapt a particular situation to the teachings of the present invention without departing from its essential scope. Therefore, it is intended that the invention not be limited to the particular embodiments disclosed, but that the invention will include all embodiments falling within the scope of the appended claims.

What is claimed is:

1. A method for forming a bipolar junction transistor and a metal oxide semiconductor field effect transistor in a semiconductor layer, comprising:
    forming first MOSFET structures in a MOSFET region of a semiconductor layer;
    forming bipolar junction transistor structures including forming an extrinsic base material layer over the semiconductor layer and an emitter material layer overlying the extrinsic base material layer in a bipolar junction transistor region of the semiconductor layer;
    forming a first material layer over the emitter material layer and the extrinsic base material layer;
    patterning the first material layer using a hardmask to form a thermal barrier layer over the emitter material layer and the extrinsic base material layer;
    patterning the emitter material layer with the hardmask to form a patterned emitter;
    patterning the extrinsic base material layer;
    forming second MOSFET structures in the MOSFET region; and
    heating the semiconductor layer with the thermal layer in place.

2. The method of claim 1 wherein forming first MOSFET structures in the MOSFET region further comprises:
    forming an isolation region;
    forming a doped tub region;
    forming a gate stack; and
    forming lightly doped regions.

3. The method of claim 1 wherein forming bipolar junction transistor structures comprises:
    forming a bipolar junction transistor collector;

depositing a base polysilicon layer, wherein the extrinsic base material layer comprises the base polysilicon layer; and depositing an emitter polysilicon layer, wherein the emitter material layer comprises the emitter polysilicon layer.

4. The method of claim 1 wherein the first material layer comprises a silicon oxynitride layer, a silicon nitride layer, a silicon carbide layer or a silicon dioxide layer having a thickness of about 30 to about 60 nm.

5. The method of claim 1 wherein the first MOSFET structures comprise a doped tub region and a gate stack, and wherein the step of forming second MOSFET structures comprises forming gate stack spacers adjacent the gate stack and forming source/drain regions in the doped tub region, and wherein the step of heating comprises heating the semiconductor layer to activate dopants forming the source/drain regions.

6. The method of claim 1 wherein patterning the first material layer and the emitter material layer using the hardmask comprises patterning the hardmask using a patterned photoresist mask.

7. The method of claim 1 wherein patterning the hardmask includes using a plasma etch comprising a mixture of carbon-fluorine gases.

8. The method of claim 7 wherein etching the first material layer comprises using a plasma etch process employing $C_2F_6$ and oxygen and etching the emitter material layer includes using a plasma etch process employing chlorine, hydrogen bromine and a mixture of helium and oxygen.

9. The method of claim 1 further comprising removing the thermal barrier layer after heating.

* * * * *